(12) United States Patent
Shi et al.

(10) Patent No.: US 10,367,126 B2
(45) Date of Patent: Jul. 30, 2019

(54) LIGHT-EMITTING DEVICE (71) Applicant: XIAMEN SANAN OPTOELECTRONICS TECHNOLOGY CO., LTD., Xiamen (CN)

(72) Inventors: Junpeng Shi, Xiamen (CN); Pei-Song Cai, Xiamen (CN); Hao Huang, Xiamen (CN); Zhenduan Lin, Xiamen (CN); Chih-Wei Chao, Xiamen (CN); Chen-Ke Hsu, Xiamen (CN)

(73) Assignee: XIAMEN SANAN OPTOELECTRONICS TECHNOLOGY CO., LTD., Xiamen (CN)

(*) Notice: Subject to any disclaimer, the term of this patent is extended or adjusted under 35 U.S.C. 154(b) by 24 days.

(21) Appl. No.: 14/725,822

(22) Filed: May 29, 2015

(65) Prior Publication Data

US 2016/0020373 A1 Jan. 21, 2016

(30) Foreign Application Priority Data

Jul. 18, 2014 (CN) ...................... 2014 2 0398633 U
Jul. 22, 2014 (CN) ...................... 2014 2 0404118 U (51) Int. Cl.
*H01L 33/00* (2010.01)
*H01L 33/62* (2010.01)
*H01L 33/60* (2010.01)
*H01L 33/64* (2010.01)
*H01L 25/075* (2006.01)

(52) U.S. Cl.
CPC .............. *H01L 33/62* (2013.01); *H01L 33/60* (2013.01); *H01L 33/647* (2013.01); *H01L 25/0753* (2013.01); *H01L 2224/48091* (2013.01); *H01L 2224/48137* (2013.01); *H01L 2224/48464* (2013.01)

(58) Field of Classification Search
CPC ........ H01L 33/62; H01L 33/60; H01L 33/647; H01L 33/52
See application file for complete search history.

(56) References Cited

U.S. PATENT DOCUMENTS

| | | | | |
|---|---|---|---|---|
| 5,011,546 A * | 4/1991 | Frazier | .................... | B23K 35/36 148/23 |
| 5,391,896 A * | 2/1995 | Wanlass | .............. | H01L 31/0687 257/440 |
| 5,789,930 A * | 8/1998 | Isaacs | ................ | G01R 31/2886 324/762.03 |
| 2003/0010975 A1* | 1/2003 | Gibb | ........................ | H01L 33/40 257/40 |
| 2006/0284195 A1* | 12/2006 | Nagai | ........................ | F21K 9/00 257/98 |

(Continued)

*Primary Examiner* — Dale E Page
*Assistant Examiner* — Quovaunda V Jefferson
(74) *Attorney, Agent, or Firm* — Syncoda LLC; Feng Ma (57) ABSTRACT

A light-emitting device includes a base having an insulating part and a metal block; a light-emitting diode (LED) chip over the base; a water soluble paste between the LED chip and the base metal block for chip fixing and heat conduction; packaging glue covering the LED chip; and the LED chip bottom, water soluble paste and the base metal block form an all-metal thermal conducting path to achieve low a thermal resistance.

16 Claims, 7 Drawing Sheets (56) References Cited

U.S. PATENT DOCUMENTS

| | | | |
|---|---|---|---|
| 2007/0057271 A1* | 3/2007 | Schiaffino | H01L 33/0095 257/99 |
| 2008/0002100 A1* | 1/2008 | Kaneko | G02F 1/133603 349/65 |
| 2008/0191232 A1* | 8/2008 | Lee | H01L 33/58 257/98 |
| 2013/0181236 A1* | 7/2013 | Tamaki | H01L 33/56 257/88 |

* cited by examiner

LIGHT-EMITTING DEVICE

CROSS-REFERENCE TO RELATED APPLICATIONS

The present application is a continuation of and claims priority to Chinese Patent Application Nos. CN 201420398633.8 filed on Jul. 18, 2014, and CN 201420404118.6 filed on Jul. 22, 2014. The disclosures of these applications are hereby incorporated by reference in their entirety.

BACKGROUND

Advantaged at environmental protection, high luminance, low power consumption, long service life, low working voltage and easy integration, light-emitting diode (LED) is the fourth-generation new light source following incandescent lamp, fluorescent lamp and high intensity discharge lamp.

The LED cannot transfer electric energy into light by 100%, and the rest energies will transfer into heat. Thermal aggregation increases LED temperature and sharply reduces luminous flux, thus resulting in color point shifting and great shortening of service life. For this reason, heat dissipation remains a key problem of LED, in particular in large power LED, from which, large heat is generated due to large power.

LED heat is mainly dissipated through heat conduction, and its heat dissipation capacity is determined by thermal resistance. Therefore, reduction of thermal resistance is a main method to solve heat dissipation problem. Sapphire substrate and die bonding paste are two main factors that impede reduction of LED thermal resistance. Low thermal conductivity of the sapphire substrate can be solved by mainstreaming vertical chip (Si substrate or alloy substrate) or flip chip yet their applications are restricted by complex process and high cost. For die bonding paste like M2 glue in common use, its 0.2 W/mK thermal conductivity significantly reduces heat dissipation. And silver adhesive, as an epoxy matrix, has poor reliability despite its high thermal conductivity.

SUMMARY

To solve the above problems, the present disclosure provides a light-emitting device with a series design of thermal conducting path structure: firstly, a water soluble paste of high thermal conductivity is used as the die bonding material and its residues like scaling powder are easily removed, improving LED heat dissipation capacity and reliability; secondly, in terms of chip, a metal blocking layer is added between the ODR and the back metal to prevent solder paste from damaging the ODR; and thirdly, the die bonding part over the base is a thin metal block capable for good heat conduction.

A light-emitting device is provided, which comprising: a base, at least comprising an insulating part and a metal block; a light-emitting diode (LED) chip over the base; a water soluble paste between the LED chip and the base metal block for chip fixing and heat conduction; packaging glue covering the LED chip; and the LED chip bottom, water soluble paste and the base metal block form an all-metal thermal conducting path.

Preferably, the LED chip is a standard chip and the side approximate to the base has a reflecting structure.

Preferably, the reflecting structure is an omnidirectional reflector (ODR), comprising a metal reflecting layer and a metal blocking layer.

Preferably, the water soluble paste is not thicker than 20 μm and is not spilled over the standard chip side to avoid light blocking.

Preferably, thermal resistance of the thermal conducting path is less than 7 K/W.

Preferably, the upper surface or the lower surface of the base metal block is not less than 40% of the upper or lower surface of the base respectively, and for the metal block, the lower surface is larger than the upper surface.

Preferably, the base is about 0.1 mm-0.5 mm thick; and most preferably, about 0.1 mm-0.3 mm thick, for better heat conduction.

Preferably, the base at least has two mutually-isolated metal blocks, in which, the first metal block is anode and the second metal block is cathode; a LED chip is provided above each metal block; the side of the LED chip that far from the base has a first electrode and a second electrode; and the first electrode and the second electrode of each LED chip are connected to their adjacent metal blocks or LEDs through wires, i.e., the electrodes are not directly connected to their own metal blocks through wires, thus increasing wire bonding space.

Preferably, the LED of each metal block covers over 50% of the metal block.

Preferably, gap between the two metal blocks is 0.1-2 mm.

Preferably, the base comprises an upper surface and a lower surface that are flat and separated from each other.

Preferably, the base has two metal blocks, a first LED chip over the first metal block and a second LED chip over the second metal block, in which, the first electrode of the first LED is connected to the second electrode of the second LED through wire; the second electrode of the first LED is connected to the second metal block through wire; and the first electrode of the second LED is connected to the first metal block through wire, thus forming a series circuit between the first and second LEDs.

The present disclosure at least has advantages below: 1) the all-metal thermal conducting path reduces thermal resistance and improves reliability; 2) different from a protruding cup-shape structure in conventional package, the base upper surface and the lower surface of the light-emitting device are flat, thus narrowing packaging size; besides, the flat upper surface makes the LED chip directly arranged over the metal block for better heat dissipation; 3) the first electrode and the second electrode of each LED chip are connected to their adjacent metal blocks or LEDs through wires, i.e., the electrodes are not directly connected to their own metal blocks through wires, thus increasing wire bonding space; in this way, the LED over the metal block is as large as possible to narrow LED packaging size and guarantee ratio of light-emitting area, in which, the light-emitting area may be over 50% or as high as 80%-90% of the metal block; and 4) a standard chip saves much cost in comparison with a flip chip and 5) the present disclosure is fit for large power applications.

The aforesaid light-emitting device can be applied in various fields such as display system, lighting system and automobile tail light.

The light-emitting system can include a plurality of the light-emitting devices or diodes according to various embodiments disclosed herein.

100: light-emitting device; 110: base; 110*a*: base upper surface; 110*b*: base lower surface; 111: first metal block; 111*a*: upper surface of the first metal block; 111*b*: lower surface of the first metal block; 112: second metal block; 112*a*: upper surface of the second metal block; 112*b*: lower surface of the second metal block; 113: insulating part of the base; 120: water soluble paste layer; 130: LED chip; 131: first-type semiconductor layer; 132: active layer; 133: second-type semiconductor layer; 134: substrate; 135: metal reflecting layer; 136: metal blocking layer; 137: Pt/Au metal layer; 138: first electrode; 139: second electrode; 140: conducting wire, 141: first wire; 142: second wire; 143: third wire; 150: packaging glue.

DETAILED DESCRIPTION

Embodiment 1

Figure 1:
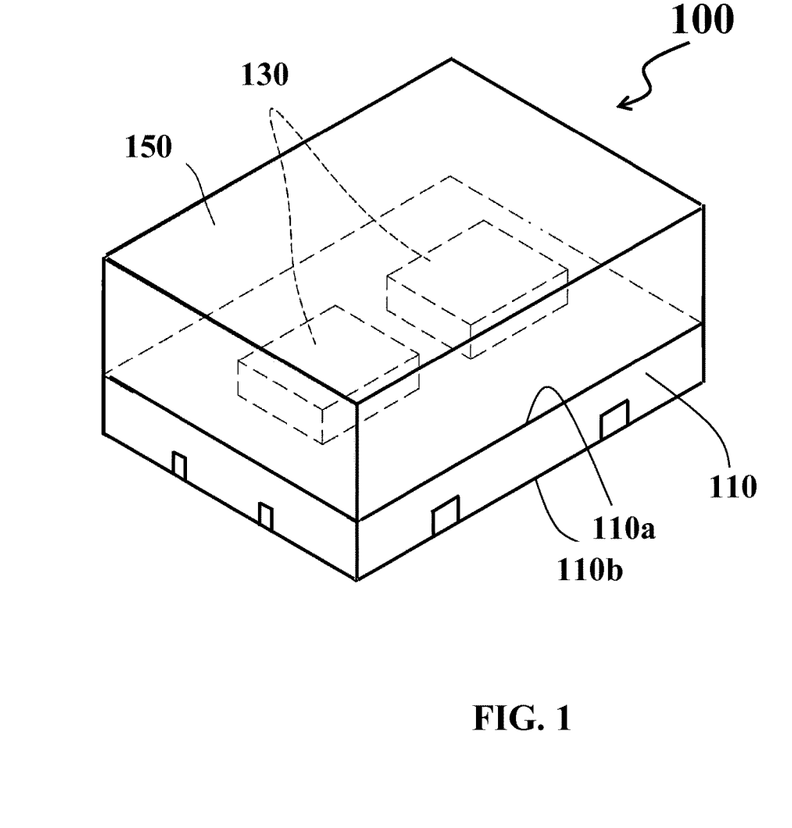
FIG. 1 is a perspective view of a light-emitting device according to Embodiment 1.
Figure 2:
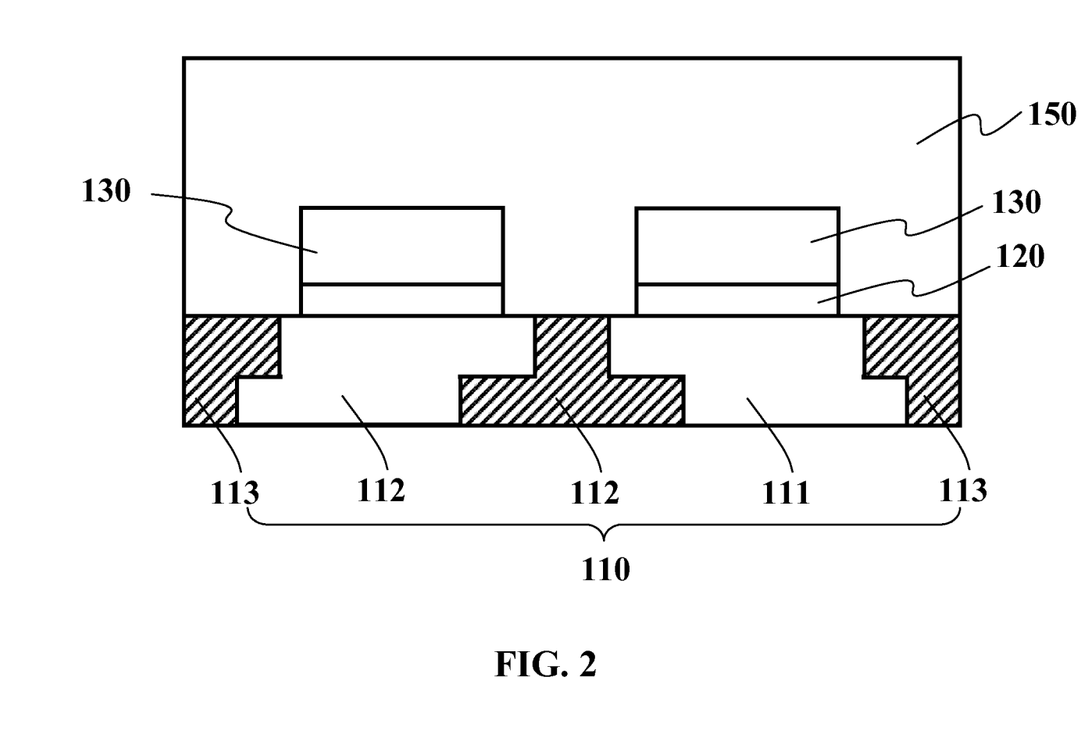
FIG. 2 is a section diagram of the light-emitting device according to Embodiment 1.

With reference to FIGS. 1 and 2, a light-emitting device, comprising a base 110, a LED chip 130 and packaging glue 150. The light-emitting device bottom is a base 110, comprising two metal blocks 111, 112 and an insulating part 113 of the base separating the metal blocks. The LED chip 130 is fixed over the metal blocks 111, 112, and the die bonding layer is a water soluble paste layer 120; after connecting bonding wire (not shown in the figure), packaging glue 150 is covered over the chip and the base surface.

Figure 3:
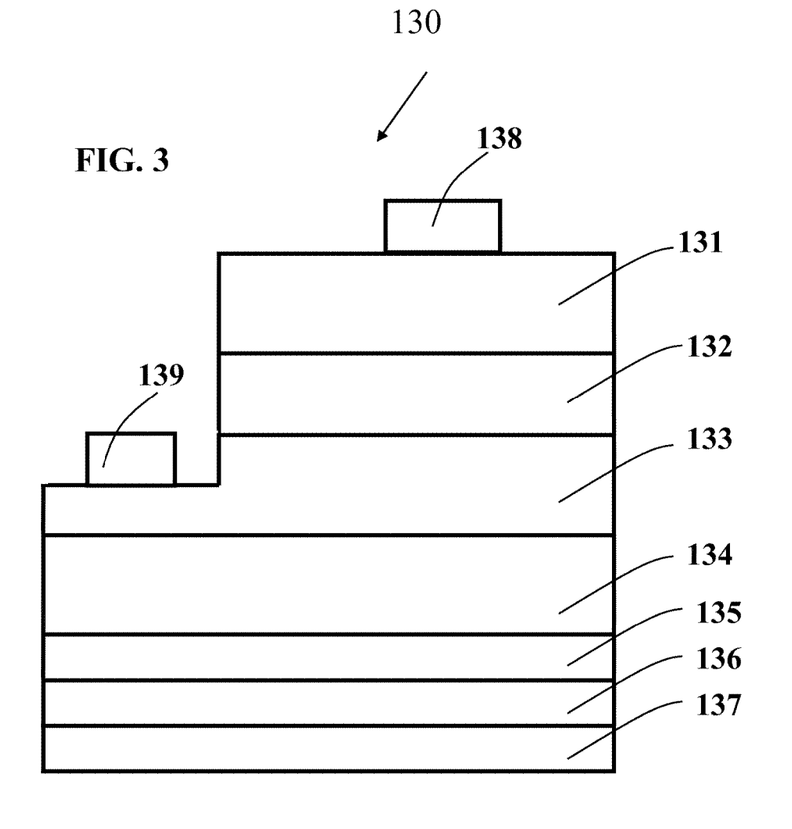
FIG. 3 is a structural section diagram of the LED chip of the light-emitting device as shown in FIG. 2.

With reference to FIG. 3, the LED chip 130 is a standard chip, comprising from up to bottom: a first-type semiconductor layer 131, an active layer 132, a second-type semiconductor layer 133, a substrate 134, a metal reflecting layer 135, a metal blocking layer 136, a Pt/Au metal layer 137, a first electrode 138 and a second electrode 139.

Figure 4:
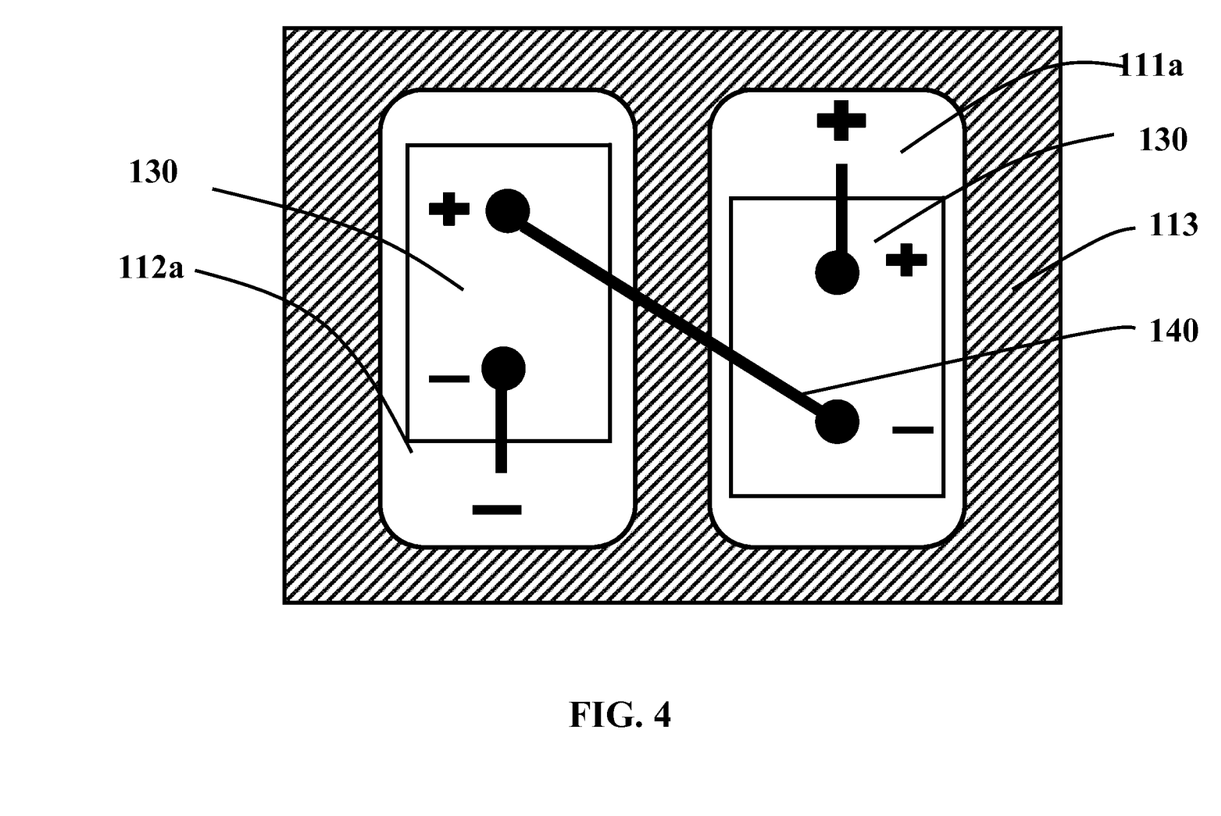
FIG. 4 is a top view of the light-emitting device as shown in FIG. 2.
Figure 5:
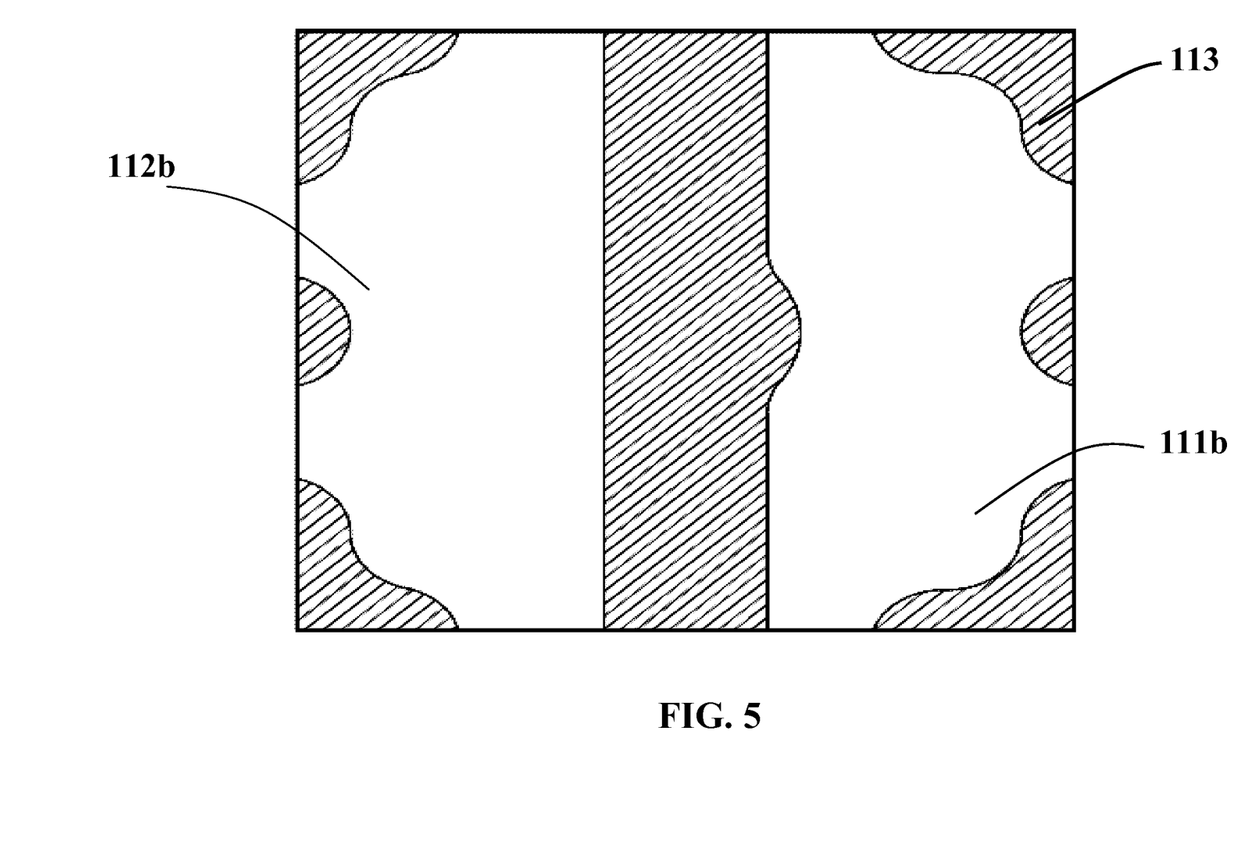
FIG. 5 is a bottom view of the light-emitting device as shown in FIG. 2.

With reference to FIGS. 4 and 5, the upper surfaces (111*a*, 112*a*) and the lower surfaces (111*b*, 112*b*) of the two metal blocks 111, 112 are not less than 40% of the upper and lower surfaces of the base respectively, and for the metal blocks, the lower surfaces 111*b*, 112*b* are larger than the upper surfaces 111*a*, 112*a*. In this embodiment, the upper surfaces (111*a*, 112*a*) of the metal block cover 40% of the base upper surface 110*a* and the lower surfaces (111*b*, 112*b*) of the metal block cover over 50% of the base lower surface 110*b*.

In this embodiment, the base 110 is about 0.1 mm-0.5 mm thick, and preferably, 0.1 mm-0.3 mm, for better heat conduction. The water soluble paste layer 120 is not thicker than 20 μm and is not spilled over the LED chip 130 side to avoid light blocking.

With reference to FIG. 4, the two metal blocks 111 and 112 over the base serve as the anode and cathode of the device for connecting external power, in which, the metal block 111 is anode and the metal block 112 is cathode; and the first electrode and the second electrode of the LED chip 130 are connected to the base metal block through the conducting wire 140 to form a series circuit.

LED heat is mainly dissipated through thermal conduction, with specific path from chip right to the device bottom. In this embodiment, form an all-metal thermal conducting path from the LED metal reflecting layer to the base bottom. Effective heat dissipation can be achieved for the thermal conductivity of metal is higher than other materials and the thermal resistance is less than 7 K/W. In chip, heat is conducted from the epitaxial layer and the substrate to the metal reflecting layer 135 and to the Pt/Au metal layer 134 through the metal blocking layer 136 and to the base metal blocks 111, 112 through the water soluble paste layer 120, and finally dissipated out of the light-emitting device.

Embodiment 2

In a preferable embodiment, the light-emitting device has a base 110, a LED chip 130 over the base 110 and packaging glue 150 over the base 110 and the LED chip 130.

Figure 6:
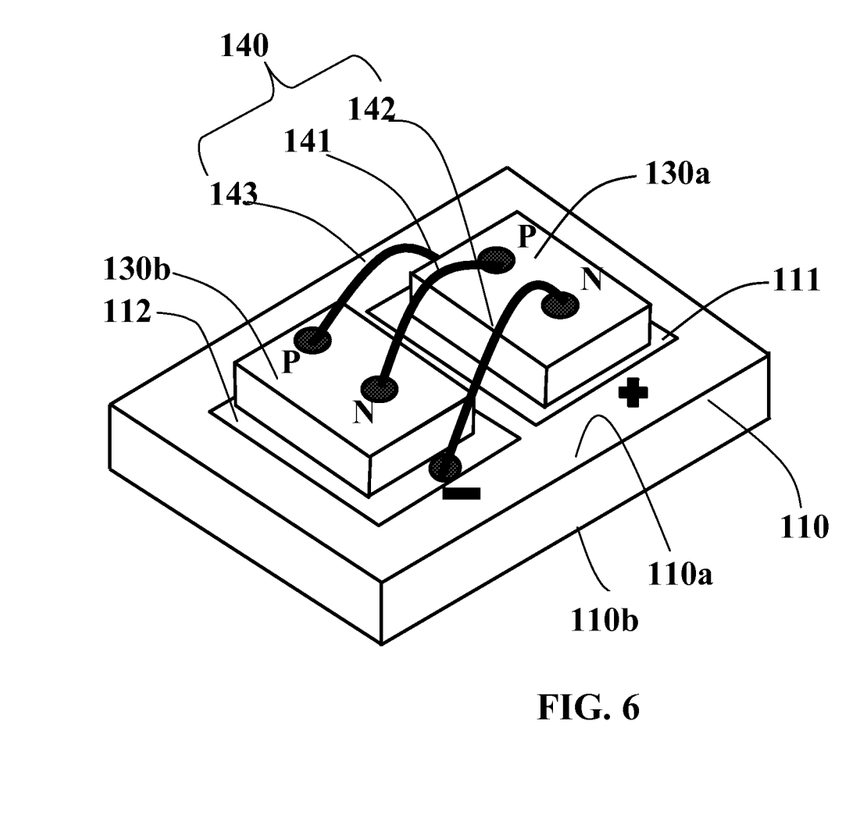
FIG. 6 is a space diagram of the light-emitting device with packaging glue removed according to Embodiment 2.
Figure 7:
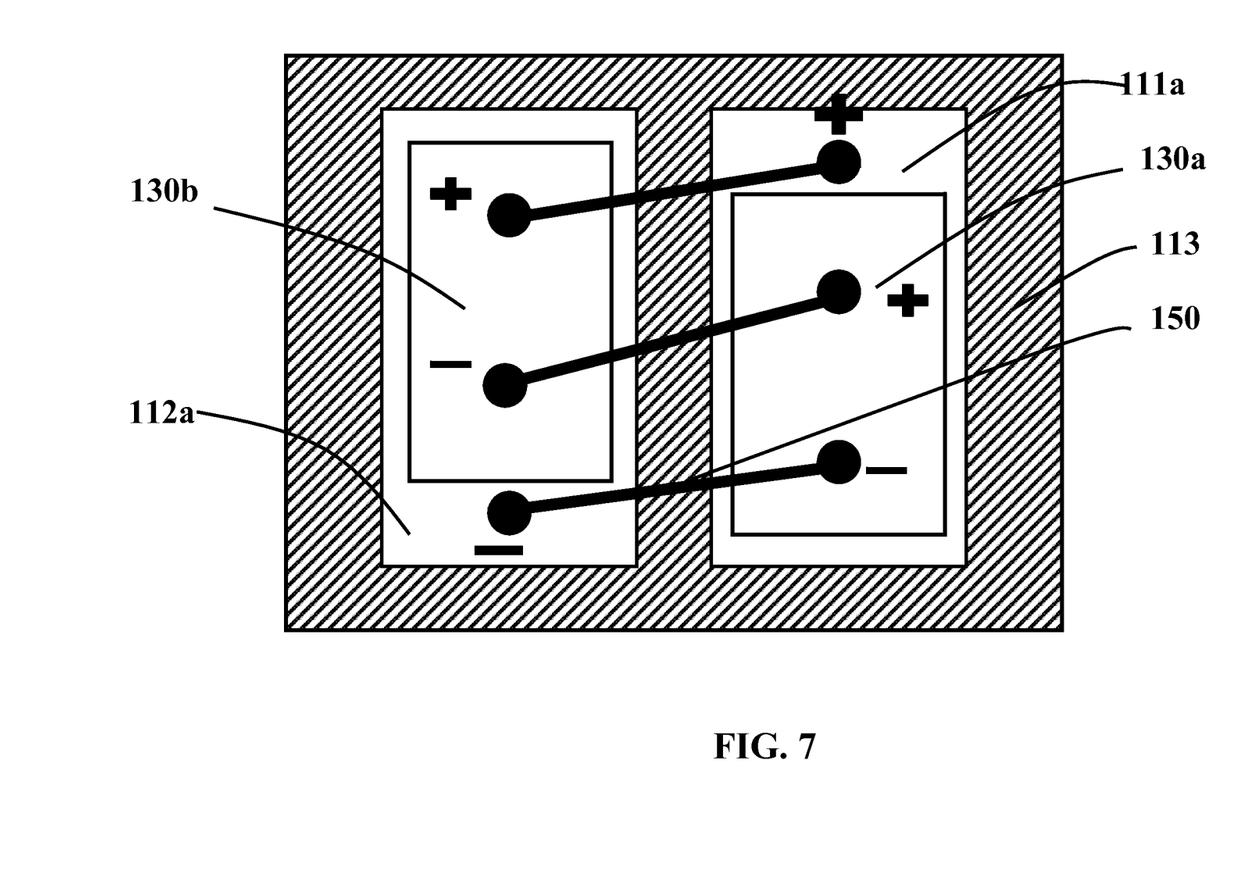
FIG. 7 is a top view of the light-emitting device as shown in FIG. 6.

With reference to FIGS. 6 and 7, the base 110 comprises an upper surface 110*a* and a lower surface 110*b* that are flat and separated from each other, comprising a first metal block 111 and a second metal block 112 that are mutually isolated, and an insulating part 113 for embedding the two metal blocks. The upper surfaces 111*a*, 112*a* of the first and second metal blocks 111, 112 are not less than 40% of the upper surface 110*a* of the base; the lower surfaces 111*b*, 112*b* of the first and second metal blocks 111, 112 are not less than 40% of the lower surface 110*b* of the base, and for the first and second metal blocks, the lower surfaces 111*b*, 112*b* are larger than the upper surfaces 111*a*, 112*a*. In this embodiment, the upper surfaces 111*a*, 112*a* of the first and second metal blocks cover about 40%-70% of the base upper surface, and the lower surfaces 111*b*, 112*b* cover over 50%-80% of the base lower surface.

With references to FIGS. 6 and 7, the upper surfaces of the first and second metal blocks are arranged with a LED chip 130 respectively, and the first and second electrodes 138, 139 of each LED chip are connected to their adjacent metal blocks or LEDs through the wire 140. In the first preferable embodiment of the present disclosure, the first metal block 111 serves as the anode of external power and the second metal block 112 serves as the cathode of external power; the first electrode 138 of the first LED 130*a* is connected to the second electrode 139 of the second LED 130*b* through the first wire 141; the second electrode 139 of the first LED 130*a* is connected to the second metal block 112 through the second wire 142; and the first electrode 138 of the second LED 130*b* is connected to the first metal block 111 through the third wire 143, thus forming a series circuit between the first and second LEDs. In this embodiment, the wires are connected to adjacent metal blocks or LED chips of adjacent metal blocks to increase wire bonding space. In this way, the LED chip over the metal block is as large as possible to narrow LED packaging size and guarantee ratio of light-emitting area. In this embodiment, light-emitting area of the LED chip 130 is over 50% of the metal block area.

All references referred to in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:
1. A light-emitting device, comprising:
a base including insulating parts and at least two metal blocks;
at least two light-emitting diode (LED) chips over the base; wherein each LED chip is configured over one of the at least two metal blocks that is associated with the each LED chip;
a water-soluble paste between the each LED chip and the associated metal block configured to fix the each LED chip and to conduct heat; and
a packaging glue covering the each LED chip;
wherein:
a bottom of the each LED chip, the water-soluble paste, and the associated metal block form an all-metal thermal conducting path;
a lower surface of the associated metal block is larger than an upper surface of the associated metal block to facilitate heat dissipation;
the upper surface of the associated metal block is larger than the bottom of the each LED chip and the water-soluble paste such that the entire bottom of the each LED is configured to dissipate heat to the upper surface of the associated metal block;
the upper and lower surfaces of the associated metal block are flat to reduce a package size; and
a side of the each LED chip distal from the base has a first electrode and a second electrode; neither of the first and second electrodes is directly connected to the associated metal block, but instead one of the first and second electrodes is connected by wiring to a neighboring metal block, over which another light-emitting element is configured, thereby increasing wire bonding space.

2. The light-emitting device of claim 1, wherein the each LED chip is a standard chip having a side adjacent to the base with an omnidirectional reflector (ODR).

3. The light-emitting device of claim 2, wherein the ODR comprises a metal reflecting layer, and a metal blocking layer configured to prevent damages to the ODR by the water-soluble paste.

4. The light-emitting device of claim 1, wherein the water-soluble paste has a thickness not larger than 20 μm; and wherein the entire bottom of the each LED chip and the water-soluble paste are disposed directly on the flat upper surface of the associated metal block to improve heat dissipation.

5. The light-emitting device of claim 1, wherein the water-soluble paste is configured not to spill over a side of the each LED chip to avoid light blocking.

6. The light-emitting device of claim 1, wherein the associated metal block is sufficiently thin, and the water-soluble paste also has a sufficiently high thermal conductivity, such that a thermal resistance of the thermal conducting path is less than 7 K/W.

7. The light-emitting device of claim 1, wherein an upper surface or a lower surface of the associated metal block has an area no less than 40% of a surface area of the base.

8. The light-emitting device of claim 1, wherein the base is about 0.1 mm-0.5 mm thick.

9. The light-emitting device of claim 1, wherein the at least two metal blocks include only two metal blocks, serving as an anode and a cathode of the base, respectively.

10. The light-emitting device of claim 1, wherein the each LED covers over 50% of the associated metal block.

11. The light-emitting device of claim 1, wherein a gap between the at least two metal blocks is 0.1-2 mm.

12. The light-emitting device of claim 1, wherein the base comprises an upper surface and a lower surface that are flat and separated from each other.

13. The light-emitting device of claim 1, wherein the base has a first and a second metal blocks among the at least two metal blocks, a first LED chip among the at least two LED chips over the first metal block and a second LED chip among the at least two LED chips over the second metal block, wherein the first electrode of the first LED chip is connected to the second electrode of the second LED chip through a wire; the second electrode of the first LED chip is connected to the second metal block through a wire; and the first electrode of the second LED chip is connected to the first metal block through wire, thereby forming a series circuit between the first and second LED chips.

14. A light-emitting system comprising a plurality of light-emitting devices, each device comprising:
a base including insulating parts and at least two metal blocks;
at least two light-emitting diode (LED) chips over the base; wherein each LED chip is configured over one of the at least two metal blocks that is associated with the each LED chip;
a water-soluble paste between the each LED chip and the associated metal block configured to fix the each LED chip and to conduct heat;
an omnidirectional reflector (ODR) including a metal reflecting layer and a metal blocking layer configured to prevent damages to the ODR by the water-soluble paste; and
a packaging glue covering the each LED chip;
wherein:
a bottom of the each LED chip, the water-soluble paste, and the associated metal block form an all-metal thermal conducting path;
an upper surface of the associated metal block is larger than the bottom of the each LED chip and the water-soluble paste such that the entire bottom of the each LED is configured to dissipate heat to the upper surface of the associated metal block;
wherein the associated metal block is sufficiently thin, and the water-soluble paste also has a sufficiently high thermal conductivity, such that a thermal resistance of the thermal conducting path is less than 7 K/W; and
a side of the each LED chip distal from the base has a first electrode and a second electrode; neither of the first and second electrodes is directly connected to the associated metal block, but instead one of the first and second electrodes is connected by wiring to a neighboring metal block, over which another light-emitting element is configured, thereby increasing wire bonding space.

15. The system of claim 14, wherein the water-soluble paste is configured not to spill over a side of the each LED chip to reduce light blocking; and wherein the entire bottom of the each LED chip and the water-soluble paste are disposed directly on the flat upper surface of the associated metal block to improve heat dissipation.

16. The system of claim 14, wherein the base at least has a first and a second mutually-isolated metal blocks among the at least two metal blocks, wherein the first metal block is an anode and the second metal block is a cathode; each LED chip among the at least two LED chips is provided over each associated metal block; a side of the each LED chip distal from the base has a first electrode and a second electrode; and the first electrode and the second electrode of the each LED chip are connected to their respectively adjacent metal blocks or LEDs through wires, and wherein the first and second electrodes are not directly connected to the associated metal block through wires, thereby increasing wire bonding space.

* * * * *